(12) United States Patent
Cho et al.

(10) Patent No.: US 6,583,452 B1
(45) Date of Patent: Jun. 24, 2003

(54) THYRISTOR-BASED DEVICE HAVING EXTENDED CAPACITIVE COUPLING

(75) Inventors: Hyun-Jin Cho, Palo Alto, CA (US); Andrew Horch, Sunnyvale, CA (US); Scott Robins, San Jose, CA (US); Farid Nemati, Menlo Park, CA (US)

(73) Assignee: T-RAM, Inc., Mountain View, CA (US)

( * ) Notice: Subject to any disclaimer, the term of this patent is extended or adjusted under 35 U.S.C. 154(b) by 0 days.

(21) Appl. No.: 10/023,060

(22) Filed: Dec. 17, 2001

(51) Int. Cl.[7] .................................................. H01L 29/74
(52) U.S. Cl. ............................ 257/107; 257/133; 257/147
(58) Field of Search ................................. 257/107, 124, 257/125, 139, 140, 146, 147, 133; 438/133, 135

(56) References Cited

U.S. PATENT DOCUMENTS

| | | |
|---|---|---|
| 3,918,033 A | 11/1975 | Case et al. |
| 3,986,177 A | 10/1976 | Picquendar et al. |
| 4,090,254 A | 5/1978 | Ho et al. |
| 4,146,902 A | 3/1979 | Tanimoto et al. |
| 4,590,589 A | 5/1986 | Gerzberg |
| 4,612,448 A | 9/1986 | Strack |
| 4,677,455 A | 6/1987 | Okajima |
| 4,959,703 A | 9/1990 | Ogura et al. |
| 5,321,285 A | 6/1994 | Lee et al. |
| 5,324,966 A | 6/1994 | Muraoka et al. |
| 5,390,145 A | 2/1995 | Nakasha et al. |
| 5,396,454 A | 3/1995 | Nowak |
| 5,412,598 A | 5/1995 | Shulman |

(List continued on next page.)

FOREIGN PATENT DOCUMENTS

| | | |
|---|---|---|
| FR | 2110326 | 6/1972 |
| JP | 57 208177 | 12/1982 |

OTHER PUBLICATIONS

Jun. 1998, F. Nemati and J.D. Plummer, *A Novel High Density, Low Voltage SRAM Cell with a Vertical NDR Device*, Center for Integrated Systems, Stanford University, Stanford, CA 94305.

F. Nemati and J.D. Plummer, *A Novel Vertical Storage SRAM Cell*, Student Paper written for Center for Integrated Systems, Stanford University, Stanford, CA 94305.

1999, F. Nemati and J.D. Plummer, *A Novel Thyristor–based SRAM Cell (T–RAM) for High–Speed, Low–Voltage, Giga–scale Memories*, Center for Integrated Systems, Stanford University, Stanford, CA, 1999.

1987, Baliga, B.Jayant, *Modern Power Devices*, pp. 349–350.

Feb. 1980, Plummer, James D. and Scharf, Brad W., *Insulated–Gate Planar Thyristors: I–Structure and Basic Operation*, pp. 380–386.

1981, S. M. Sze, *Physics of Semiconductor Devices Second Edition*, John Wiley & Sons, pp. 198–209, 1981.

*Primary Examiner*—Tuan H. Nguyen

(57) ABSTRACT

A thyristor-based semiconductor device has a thyristor that exhibits increased capacitive coupling between a conductive structure and a portion of a thyristor. According to an example embodiment of the present invention, the thyristor-based semiconductor device is manufactured having an extended portion that is outside a current path through the thyristor and that capacitively couples a conductive structure to a portion of the thyristor for controlling the current through the path. In one particular implementation, the extended portion extends from a base region of the thyristor and is outside of a current path through the base region and between an adjacent base region and an adjacent emitter region. A gate is formed capacitively coupled to the base region via the extended portion. In this manner, the control of the thyristor with the gate exhibits increased capacitive coupling, as compared to the control without the extended portion.

23 Claims, 7 Drawing Sheets

U.S. PATENT DOCUMENTS

| | | |
|---|---|---|
| 5,464,994 A | 11/1995 | Shinohe et al. |
| 5,471,419 A | 11/1995 | Sankaranarayanan et al. |
| 5,525,820 A | 6/1996 | Furuyama |
| 5,543,652 A | 8/1996 | Ikeda et al. |
| 5,587,944 A | 12/1996 | Shen et al. |
| 5,689,458 A | 11/1997 | Kuriyama |
| 5,874,751 A | 2/1999 | Iwamuro et al. |
| 5,910,738 A | 6/1999 | Shinohe et al. |
| 5,914,503 A | 6/1999 | Iwamuro et al. |
| 5,936,267 A | 8/1999 | Iwamuro |
| 5,939,736 A | 8/1999 | Takahashi |
| 5,981,984 A | 11/1999 | Iwaana et al. |
| 6,229,161 B1 | 5/2001 | Nemati et al. |
| 2002/0093030 A1 * | 7/2002 | Hsu et al. .................. 257/162 |
| 2002/0100918 A1 * | 8/2002 | Hsu et al. .................. 257/200 |

* cited by examiner

THYRISTOR-BASED DEVICE HAVING EXTENDED CAPACITIVE COUPLING

FIELD OF THE INVENTION

The present invention is directed to semiconductor devices and, more specifically, to semiconductor devices including thyristor-based devices.

BACKGROUND

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small semiconductor device packages. The improvements in such devices has led to a dramatic increase in their use in a variety of applications. As the use of these devices has become more prevalent, the demand for reliable and affordable semiconductor devices has increased. Accordingly, the need to manufacture such devices in an efficient and reliable manner has become increasingly important.

An important part in the circuit design, construction, and manufacture of semiconductor devices concerns semiconductor memories; the circuitry used to store digital information. Conventional random access memory devices include a variety of circuits, such as SRAM and DRAM circuits. The construction and formation of such memory circuitry typically involves forming at least one storage element and circuitry designed to access the stored information.

Various SRAM cell designs based on NDR (Negative Differential Resistance) devices have been proposed in the past. These designs typically consist of at least two active elements, including an NDR device. The NDR device is important to the overall performance of this type of SRAM cell. A variety of NDR devices have been introduced ranging from a simple bipolar transistor to complicated quantum-effect devices. One advantage of the NDR-based cell is the potential of having a cell area smaller than 4T (four transistor) and 6T (six transistor) SRAM cells because of the smaller number of active devices and interconnections. Conventional NDR-based SRAM cells, however, have many problems that have prohibited their use in commercial SRAM products. Some of these problems include: high standby power consumption due to the large current needed in one or both of the stable states of the cell; excessively high or excessively low voltage levels needed for the cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

NDR devices including thyristors are also widely used in power switching applications because the current densities carried by such devices can be very high in their on state. Additionally, in a thin capacitively coupled thyristor device, a base region is capacitively coupled to a control port, such as a gate. This capacitive coupling enhances the switching of the thyristor between the blocking state and conducting state. An important aspect of a thin capacitively-coupled thyristor device is that the body of the thyristor is thin enough so that the capacitive coupling between the control port and the thyristor base region can substantially modulate the potential of the base region. Because of this, the manufacture of the thin capacitively-coupled thyristor device can be difficult.

The above-mentioned difficulties associated with the formation of thyristor-based devices have presented and continue to present challenges to the manufacture and implementation of such devices.

SUMMARY

The present invention is directed to thyristor-based devices that address the above-mentioned challenges. The present invention is exemplified in a number of implementations and applications, some of which are summarized below.

According to an example embodiment of the present invention, a semiconductor device includes a thyristor having an extended portion that capacitively couples a portion of a control port (e.g., a gate) to the thyristor. The thyristor includes at least two contiguous regions of different polarity, a first one of the contiguous regions having a portion in a current path extending between two other regions of the thyristor and having an extended portion outside the current path and extended from the thyristor. A conductive structure faces the extended and/or the current path portions of the first one of the contiguous regions and is capacitively coupled to the extended and/or current path portions. The conductive structure is adapted to control the thyristor via the capacitive coupling. In this manner, the extended portion increases the capacitive coupling to the thyristor, addressing challenges including those discussed above.

According to another example embodiment of the present invention, a memory cell having a thin capacitively coupled thyristor thin capacitively-coupled thyristor has an extended portion from the thyristor that capacitively couples a gate to the thin capacitively-coupled thyristor. The thin capacitively-coupled thyristor includes a body having an anode (e.g., a P+ emitter region) a N-doped base region, a P-doped base region and a cathode (e.g., an N+ emitter region). One or both of the base regions has a portion that extends outside of a current path extending between the other base region and the emitter adjacent to the first base region of the thyristor. A gate dielectric is formed on the base region with an extended portion, and a control gate is formed on the gate dielectric. The control gate is capacitively coupled to the base region with the extended portion via the gate dielectric and adapted to control the thyristor via the capacitive coupling. A pass gate transistor having a gate and two source/drain regions is electrically coupled via one of the source/drain regions to one of the emitter regions.

In another example embodiment of the present invention, the surface area of the base region is increased, for example, by roughening and/or adding texture to the surface. The control port is capacitively coupled to the base region via the roughened and/or textured surface, which increases the capacitive coupling between the control port and the base region.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
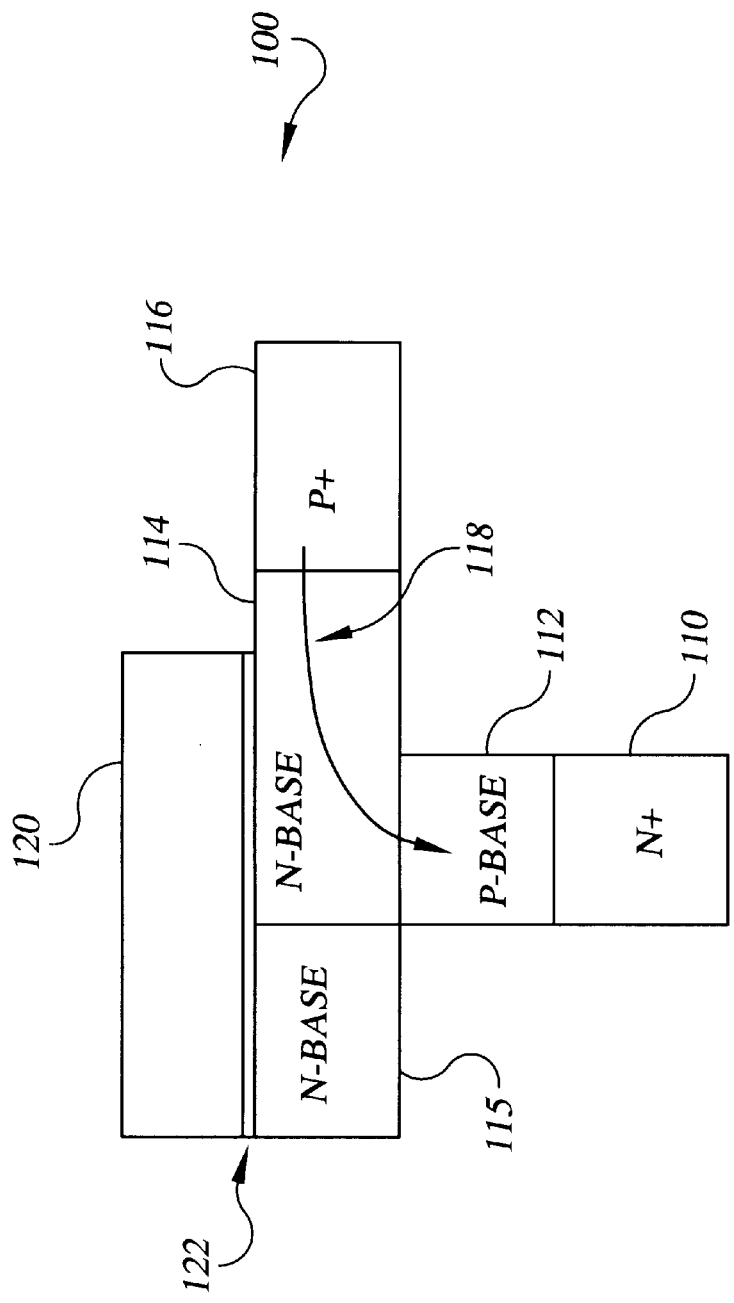
FIG. 1 is a thyristor having an extended region capacitively coupled to a control port, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for devices employing thyristor-based structures, such as memory cells. While the present invention is not necessarily limited to such devices, various aspects of the invention may be appreciated through a discussion of examples using this context.

According to an example embodiment of the present invention, capacitive coupling from a conductive structure (e.g., a control port, or gate) to a body region of a thyristor-based semiconductor device is increased via an extended portion of the body that is outside of a current path through the thyristor. The control port is adjacent to the extended portion and, in one implementation, is also adjacent to at least a portion of the body that is in the current path. The extended portion is adapted to capacitively couple a voltage at the control port to the thyristor, which adds to the capacitive coupling of the voltage to the portion of the thyristor that is in the current path. In this manner, control of the thyristor (e.g., the switching between a pass state and a blocking state using a signal coupled to a region of the thyristor) is improved by enhancing the ability of the control port to modulate the base region through which current passes in the thyristor.

In a more particular example embodiment of the present invention, the thyristor includes anode and cathode end portions, each end portion having a base region and an emitter region. The base and emitter regions of the cathode end portion are electrically coupled to one another and the base and emitter regions of the anode end portion are electrically coupled to one another. The base regions of the anode and cathode end portions are also electrically coupled to one another, forming a current path between the emitter regions and through the base regions. A first one of the base regions is formed having a first portion in the current path between the emitter and base regions to which it is electrically coupled and a second extended portion that is out of the current path. A dielectric is formed on the first and second portions of the first base region and a gate is formed over the dielectric and capacitively coupled to the first base region. The portion of the gate formed over the second extended portion adds to the capacitive coupling between the gate and the first portion.

The present invention is applicable to a variety of semiconductor devices, and can be accomplished using a variety of orientations and arrangements. FIG. 1 shows a thyristor 100 having an extended region 115, according to one example embodiment of the present invention. The thyristor includes a cathode end portion having an N+ emitter region 10 and a P-base region 112. An anode end portion includes a P+ emitter region 116, a first N-base region 114 and an extended N-base region 115. The first N-base region 114 is part of a current path, depicted by arrow 118, between the P+ emitter region of the anode and the P-base region of the cathode. The extended N-base region 115 is out of the current path 118. A gate 120 and a gate dielectric 122 are formed over a portion of each of the first N-base region 114 and the extended N-base region 115 and are used to control the current flow through the first N-base region 114. A voltage signal at the gate is capacitively coupled to the first N-base region via the dielectric 122 formed on the first N-base region 114 and via the extended N-base region 115, which adds to the capacitive coupling via the first N-base region 114. In one particular implementation, the gate is adapted to capacitively couple a signal to control the current passing through the first N-base region 114 independently from any MOS inversion channel formation against the either one or both of the first and extended N-base regions.

In another implementation, the surface of the N base region 114 and the extended N base region 115 on which the gate dielectric 122 is formed in a manner that increases the surface area of the N base region. The increased surface area increases the interfacing between the N base and the gate dielectric, thereby increasing the capacitive coupling to the gate 120. The formation methods may include, for example, deposition of non-planar polysilicon, laser etching, chemical etching and polishing.

Figure 2:
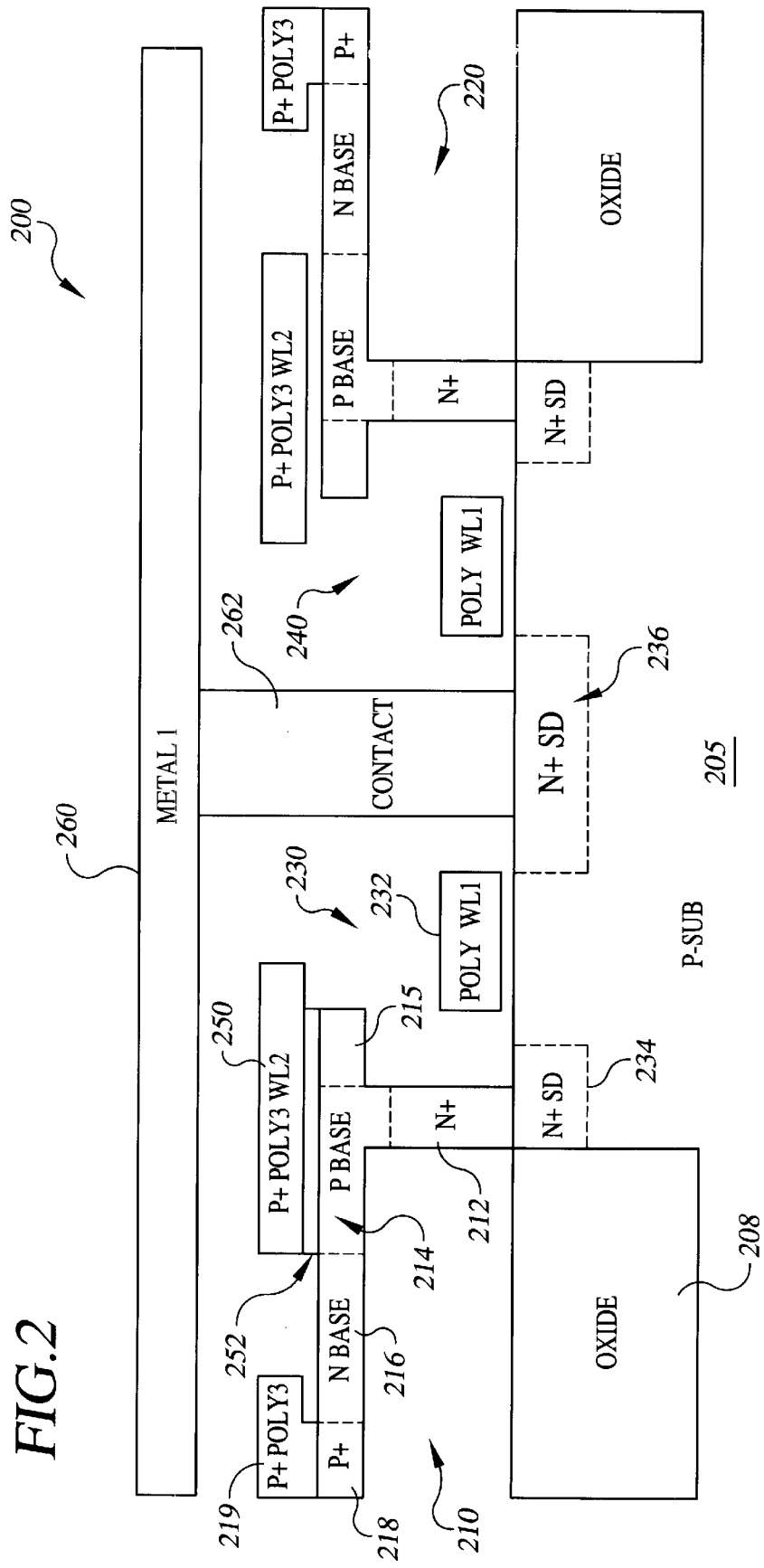
FIG. 2 is a semiconductor device having a thyristor with an extended portion, according to another example embodiment of the present invention.

FIG. 2 shows a thyristor-based semiconductor device 200, according to another example embodiment of the present invention. Two thyristor structures 210 and 220 having similar features are shown, and the description below of structure 210 also applies to structure 220. In this instance, the thyristors are formed over a substrate in which portions of pass gates 230 and 240 are formed. For more information regarding the formation of a thyristor over a substrate, and for general information regarding the formation of a thyristor, reference may be made to U.S. patent application Ser. No. 10/023,052, entitled "Thyristor-based Device Over Substrate Surface" and filed concurrently herewith.

Thyristor structure 210 includes a cathode end portion having N+ emitter region 212, a first P base region 214 and a second extended P base region 215. The first P base region 214 is adjacent to an anode end portion of the thyristor having N base region 216 and P+ emitter regions 218 and 219. In one implementation, the P+ emitter regions 218 and 219 are a single contiguous region. A gate dielectric 252 is formed on the P base regions 214 and 215, and a gate 250 is formed on the gate dielectric. The extended portion 215 of the P base region adds to the capacitive coupling between the gate 250 and the P base region 214. Current flows between the N base region and the N+ emitter region 212 through the first P base region 214 without necessarily flowing through the second extended P base region 215.

The device 200 further includes pass gates 230 and 240 having a source/drain region electrically coupled to the cathode emitter of each of thyristor devices 210 and 220. In specific regard to pass gate 230, source/drain region 234 is electrically connected to the N+ emitter region 212, effectively acting as part of the emitter of the thyristor 210. The pass gate 230 also includes source/drain region 236 and a poly gate 232 adapted to control the pass gate. An oxide isolation region 208 isolates the source/drain region 234 from other circuitry in the device.

In a more particular example embodiment of the present invention (not shown), the thyristor-based device 200 is coupled to an array of switching devices, each switching device including a similar thyristor-based structure. The array is used, for example, as a memory array or other semiconductor arrangement. The gate 232 of the pass gate 230 is coupled to other circuitry and forms a first word line (WL1). The thyristor gate 250 is also coupled to other circuitry and forms a second word line (WL2). Similarly, the emitter region 219 is coupled to other circuitry (e.g., such as emitter regions of additional thyristors). The source/drain region 236 is electrically coupled to a metal 1 interconnect 260 via a contact 262. Various ones of the other example embodiments described herein may be coupled to additional circuitry as discussed in connection with FIG. 2. In addition, similar features in the remaining drawings are labeled in a similar manner to the features in FIG. 2, and the description of the features in FIG. 2 applies to the similarly-labeled features in other Figures.

Figure 3:
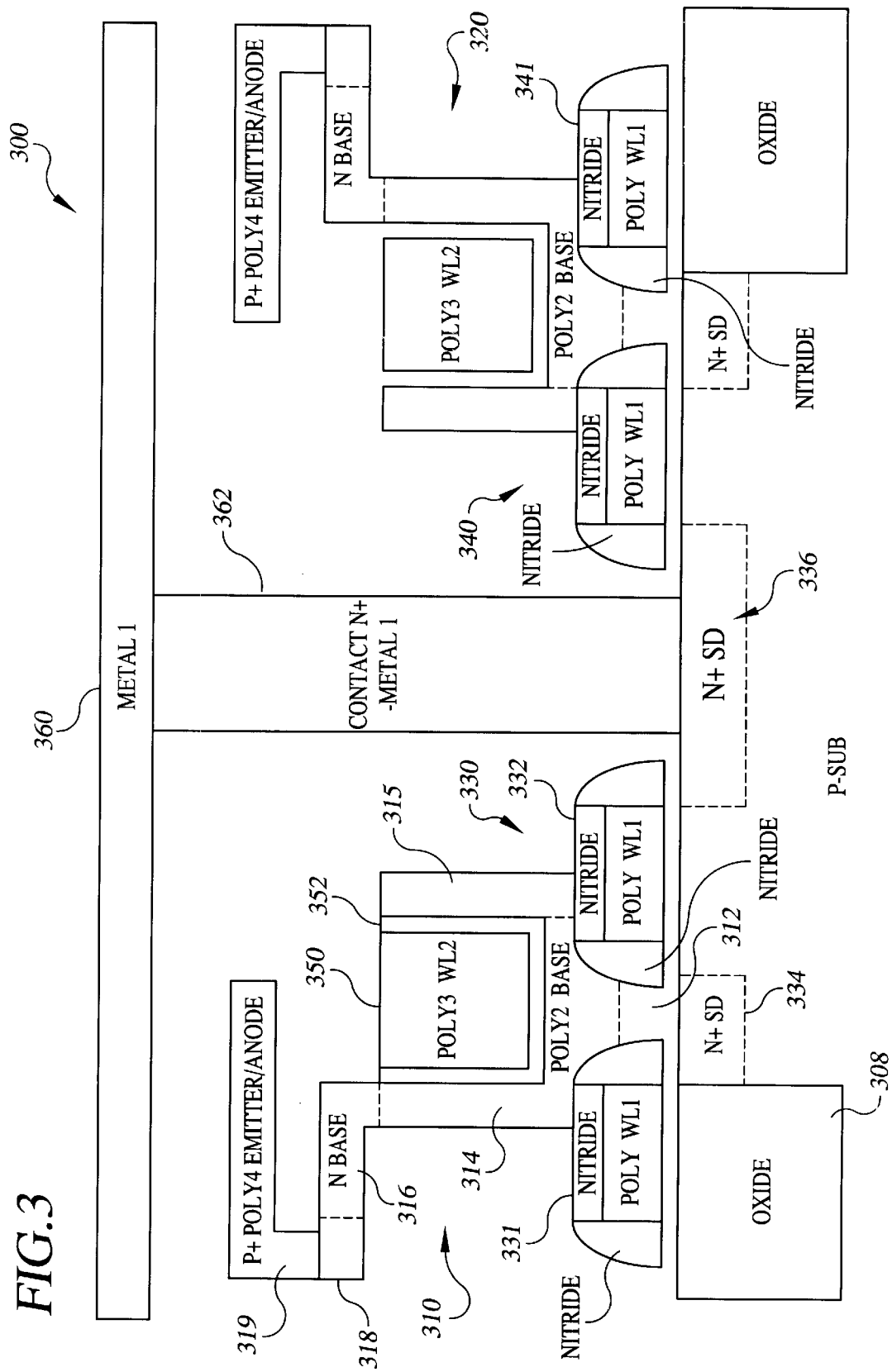
FIG. 3 is a semiconductor device having a thyristor with an extended portion, according to another example embodiment of the present invention.

FIG. 3 shows a thyristor-based semiconductor device 300, according to another example embodiment of the present invention. Two thyristor structures 310 and 320 having similar features are shown, and the description below of structure 310 also applies to structure 320. In this instance, the thyristors 310 and 320 are formed over a substrate in which portions of pass gates 330 and 340 are formed, and over a portion of first word lines (WL1) 331 and 341. The first word lines 331 and 341 can be coupled to other circuitry in the device (not shown), such as decoders and selectively adjustable resistance networks. Thyristor structure 310 includes a cathode end portion having N+ emitter region 312, a first P base region 314 and a second extended P base region 315. The first P base region 314 is adjacent an anode end portion of the thyristor having N base region 316 and P+ emitter regions 318 and 319. In one implementation, the P+ emitter regions 318 and 319 are a single contiguous region. A gate dielectric 352 is formed on the P base regions 314 and 315, and a gate 350 is formed on the gate dielectric. The extended portion 315 of the P base region adds to the capacitive coupling between the gate 350 and the P base region 314. Current can flow between the N base region and the N+ emitter region 312 through the first P base region 314 without necessarily needing to flow through the second extended P base region 315 (although current may also flow through region 315 since current naturally spreads to flow through the lowest resistance path).

The device 300 further includes pass gates 330 and 340 having a source/drain region electrically coupled to the cathode emitter of each of thyristor devices 310 and 320. In specific regard to pass gate 330, source/drain region 334 is electrically coupled to the N+ emitter region 312, effectively acting as part of the emitter of the thyristor 310. The pass gate 330 also includes source/drain region 336, shared with pass gate 340, and a poly gate 332 adapted to control the pass gate. An oxide isolation region 308 isolates the source/drain region 334 from other circuitry in the device. The thyristors 310 and 320 are also shown formed over word lines 331 and 341, respectively, that are coupled to other circuitry in the device 300. The source/drain region 336 is coupled to an interconnect 360 via a contact 362.

Figure 4A:
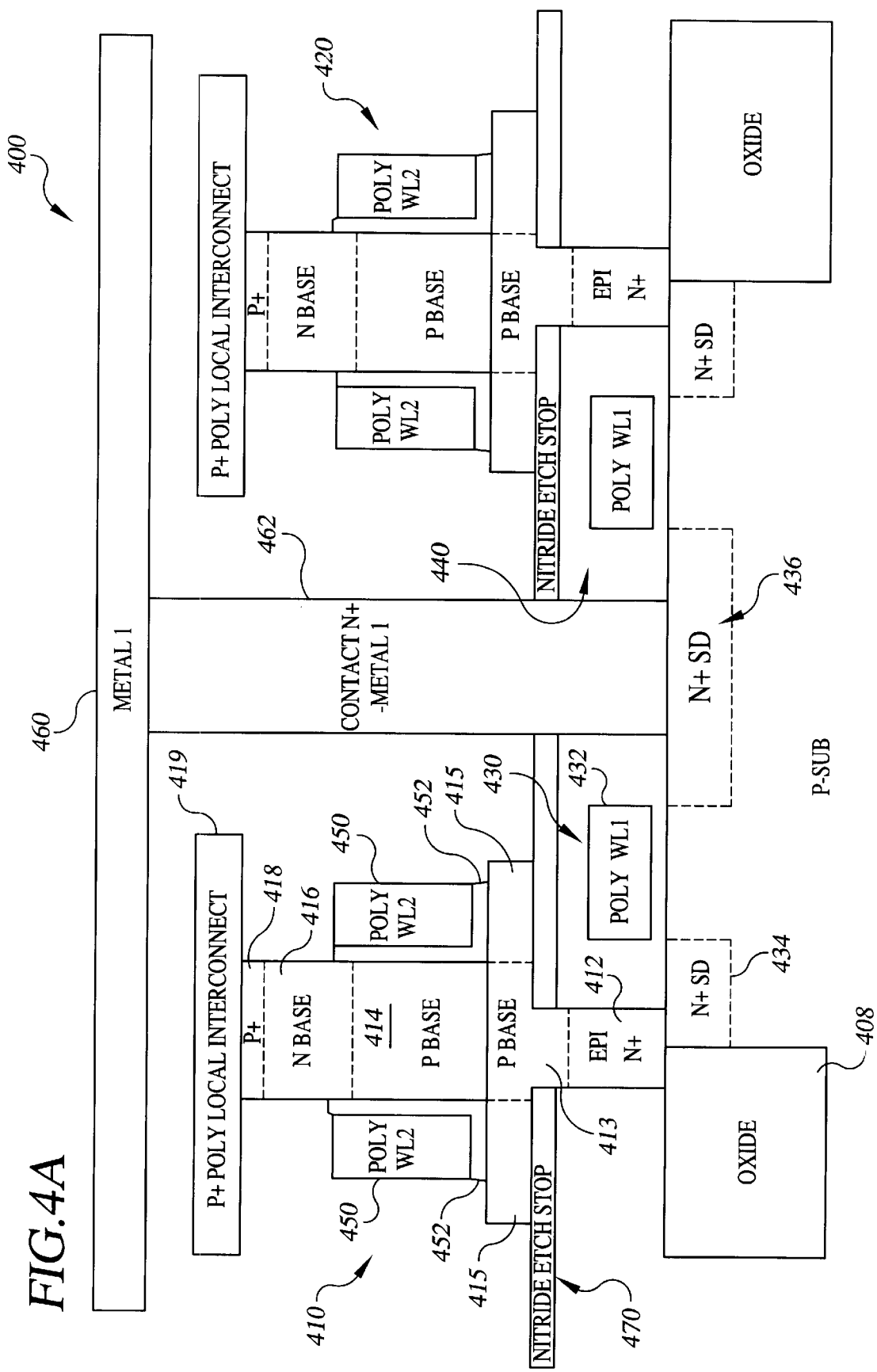
FIG. 4A is a semiconductor device having a thyristor with an extended portion, according to another example embodiment of the present invention.

FIG. 4A shows a thyristor-based semiconductor device 400, according to another example embodiment of the present invention. Two thyristor structures 410 and 420 having similar features are shown, and the description below of structure 410 also applies to structure 420. In this instance, the thyristors 410 and 420 are formed over a substrate in which portions of pass gates 430 and 440 are formed. Thyristor structure 410 includes a cathode end portion having N+ emitter region 412, a first P base region 414, a second extended P base region 415 and a third P base region 413. The first P base region 414 is adjacent an anode end portion of the thyristor having N base region 416 and P+ emitter regions 418 and 419. In another implementation, the P+ emitter regions 418 and 419 are a single contiguous region. A gate dielectric 452 is formed on and around the P base region 414 and on P base region 415, and a gate 450 is formed on and around the gate dielectric.

Figure 4B:
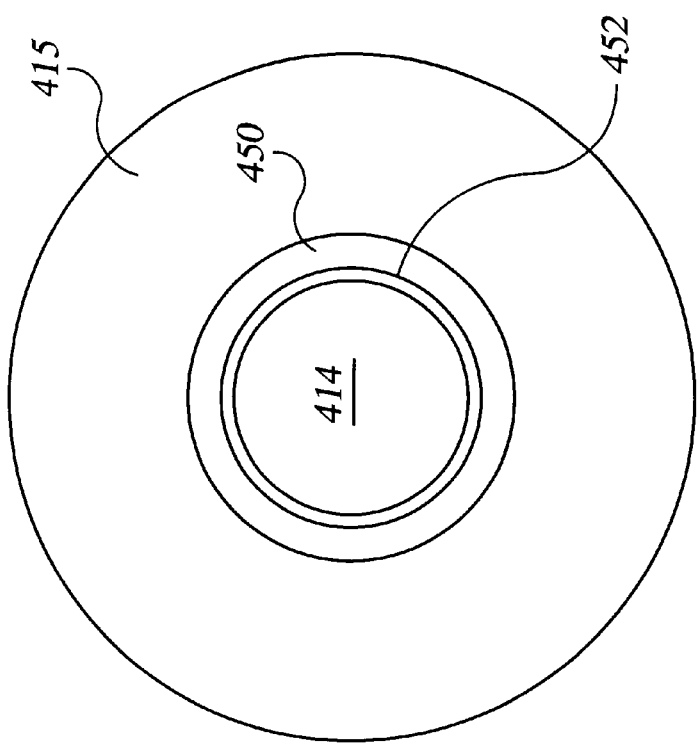
FIG. 4B is an example top-down view of a portion of the semiconductor device shown in FIG. 4A, according to another example embodiment of the present invention

FIG. 4B shows an example partial top-down view of the P base region 414 and the surrounding gate dielectric 452 and gate 450 that are over the extended P base region 415, according to a more specific example embodiment of the present invention. The extended portion 415 of the P base region adds to the capacitive coupling between the gate 450 and the P base region 414. Current flows between the N base region and the N+ emitter region 412 through the first and third P base regions 414 and 413, respectively, without necessarily flowing through the second extended P base region 415.

The device 400 further includes pass gates 430 and 440 having a source/drain region electrically coupled to the cathode emitter of each of thyristor devices 410 and 420. In specific regard to pass gate 430, source/drain region 434 is electrically coupled to the N+ emitter region 412. The pass gate 430 also includes source/drain region 436, shared with pass gate 440, and a poly gate 432 adapted to control the pass gate. An oxide isolation region 408 isolates the source/drain region 434 from other circuitry in the device. The source/drain region 436 is coupled to an interconnect 460 via a contact 462.

Figure 5:
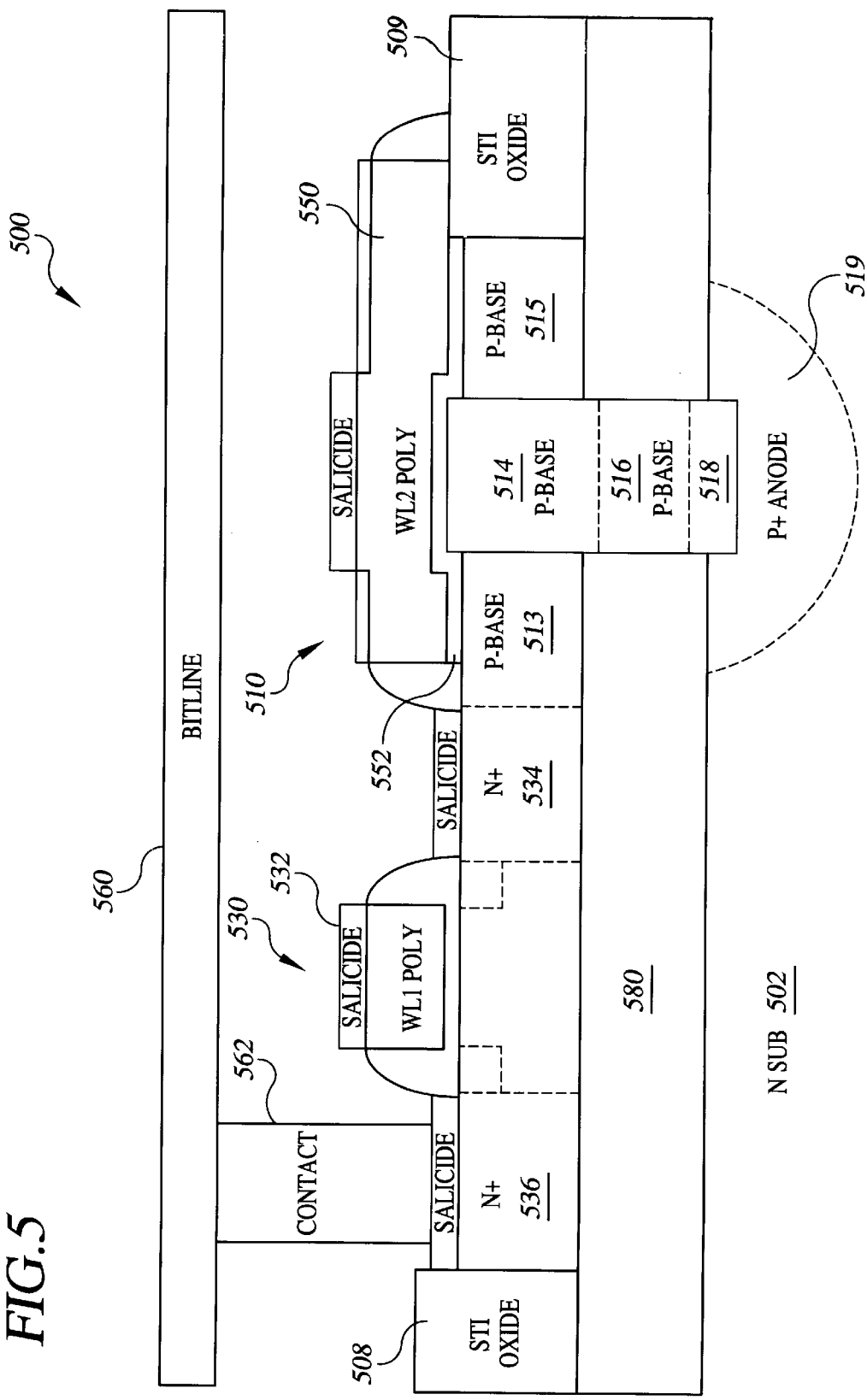
FIG. 5 is a semiconductor device having a thyristor with an extended portion, according to another example embodiment of the present invention.

FIG. 5 shows a thyristor-based semiconductor device 500 having silicon on insulator (SOI) structure, according to another example embodiment of the present invention. The device includes thyristor structure 510 having a cathode end portion including N+ emitter region 534, a first P base region 514, a second extended P base region 515 and a third P base region 513. The first P base region 514 is adjacent an anode end portion of the thyristor having N base region 516 and P+ emitter regions 518 and 519. The P base region 514 and N base region 516 extend into an opening in the insulator 580 of the SOI structure. The P+ anode 519 includes a portion of N substrate 502 that has been doped to P+. In one implementation, the P+ emitter regions 518 and 519 are a single contiguous region, and in another implementation, the substrate material, 502, is p-type. A gate dielectric 552 is formed on the P base regions 513, 514 and 515, and a gate 550 is formed on the gate dielectric. The extended portion 515 of the P base region adds to the capacitive coupling between the gate 550 and the P base region 514. Current flows between the N base region 516 and the N+ emitter region 534 through the first and third P base regions 514 and 513, respectively, without flowing through the second extended P base region 515.

The device 500 further includes a SOI pass gate 530 having a source/drain region 534 that also is used as the cathode emitter of the thyristor device 510. The pass gate 530 also includes source/drain region 536 and a poly gate 532 adapted to control the pass gate, and is formed on the insulator 580. An oxide isolation region 508 isolates the source/drain region 536 from other circuitry, and another oxide isolation region 509 isolates the thyristor from other circuitry. The gates 550 and 532 and source/drain regions 534 and 536 are shown having an optional salicide layer. The source/drain region 536 is coupled to an interconnect 560 via a contact 562.

Figure 6:
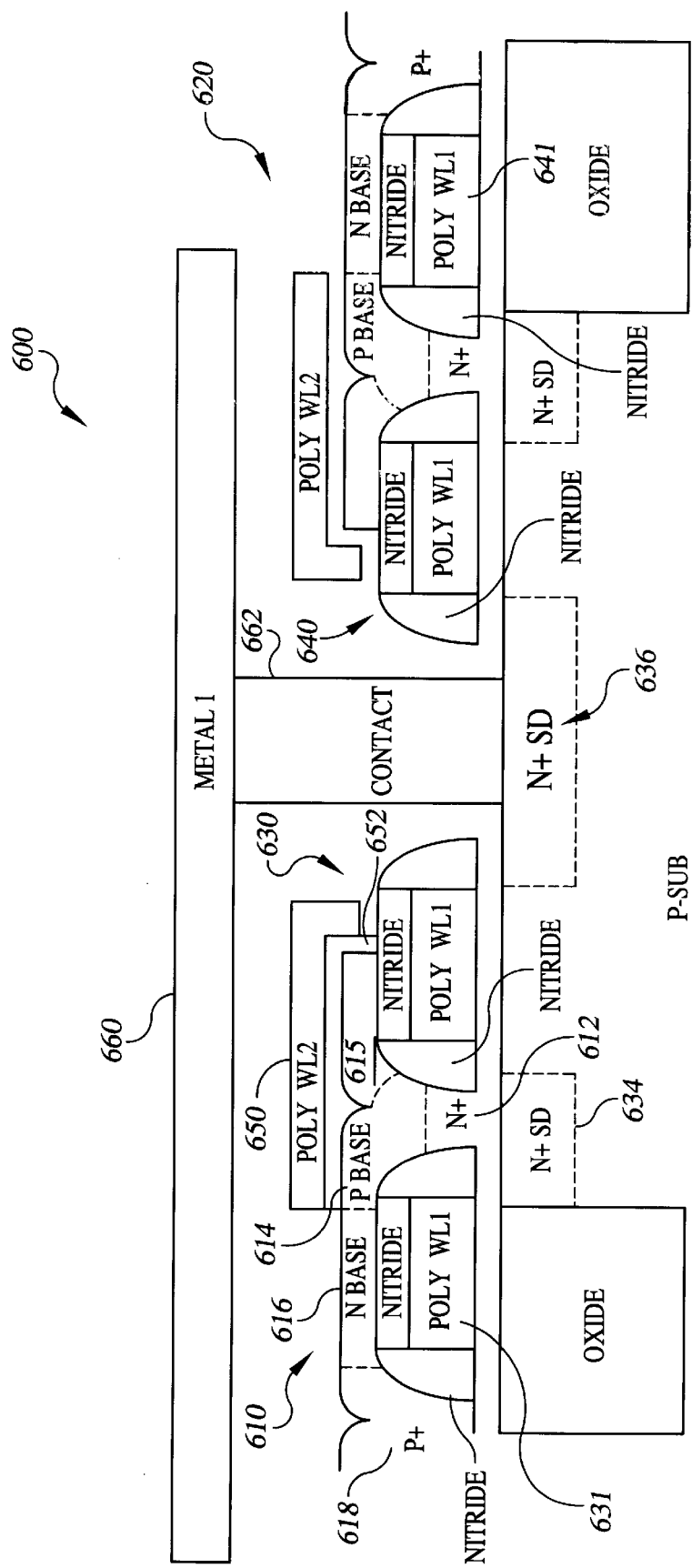
FIG. 6 is a semiconductor device having a thyristor with an extended portion, according to another example embodiment of the present invention.

FIG. 6 shows a thyristor-based semiconductor device 600, according to another example embodiment of the present invention. Two thyristor structures 610 and 620 having similar features are shown, and the description below of structure 610 also applies to structure 620. In this instance, the thyristors 610 and 620 are formed over a substrate in which portions of pass gates 630 and 640 are formed, and over a portion of first word lines (WL1) 631 and 641, which can be coupled to other circuitry in the device (not shown). Thyristor structure 610 includes a cathode end portion having N+ emitter region 612, a first P base region 614 and a second extended P base region 615. The first P base region 614 is adjacent an anode end portion of the thyristor having N base region 616 and P+ emitter region 618. A gate dielectric 652 is formed on the P base regions 614 and 615, and a gate 650 is formed on the gate dielectric. The extended portion 615 of the P base region adds to the capacitive coupling between the gate 650 and the P base region 614. Current flows between the N base region and the N+ emitter region 612 through the first P base region 614 without necessarily flowing through the second extended P base region 615.

The device 600 further includes pass gates 630 and 640 having a source/drain region electrically coupled to the cathode emitter of each of thyristor devices 610 and 620. In specific regard to pass gate 630, source/drain region 634 is electrically coupled to the N+ emitter region 612, effectively acting as part of the emitter of the thyristor 610. The pass gate 630 also includes source/drain region 636, shared with pass gate 640, and a poly gate 632 adapted to control the pass gate. An oxide isolation region 608 isolates the source/drain region 634 from other circuitry in the device. The thyristors 610 and 620 are also shown formed over word lines 631 and 641, respectively, that are coupled to other circuitry in the device 600. The source/drain region 636 is coupled to an interconnect 660 via a contact 662.

The present invention is applicable to a variety of devices including, among others, memory devices and switching devices. On such device includes a type of NDR-based SRAM ("TCCT RAM") that can potentially provide the speed of conventional SRAM at the density of DRAM in a CMOS compatible process. This SRAM cell uses a thin capacitively coupled NDR device and more specifically a thin capacitively coupled thyristor to form a bistable element for the SRAM cell. For more details of specific examples of this device and general operating principles, reference may be made to: "A Novel High Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, and "A Semiconductor Capacitively-Coupled NDR Device And Its Applications For High-Speed High-Density Memories And Power Switches," PCT Int'l Publication No. WO 99/63598, corresponding to U.S. Pat. No. 6,229,161 B1. Each of these documents is incorporated by reference in its entirety.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of PN sections in the current-switching device; and interchanging P and N regions in the device structures and/or using PMOSFETS rather than NMOSFETS. In addition, for more information regarding implementations to which the present invention is applicable, reference may be made to U.S. Pat. No. 6,229,161, dated May 8, 2001 and entitled "Semiconductor Capacitively-Coupled NDR Device And Its Applications In High-Density High-Speed Memories And In Power Switches," which is fully incorporated herein by reference. Such modifications and changes do not depart from the true spirit and scope of the present invention that is set forth in the following claims.

What is claimed is:

1. A semiconductor device comprising:
   a thyristor having contiguous regions including at least two contiguous regions of different polarity, a first one of the contiguous regions having a portion in a current path traversing two regions of the thyristor other than the first one of the contiguous regions and having an extended portion arranged outside the current path; and
   a conductive structure facing and capacitively coupled to the extended portion of the first one of the contiguous regions, the conductive structure being adapted to control current passing through the thyristor via the capacitive coupling.

2. The device of claim 1, wherein the extended portion is arranged immediately adjacent to only one contiguous region.

3. The device of claim 1, wherein the extended portion is arranged immediately adjacent to only one contiguous region and has a polarity that is common to the immediately-adjacent contiguous region.

4. The device of claim 1, wherein at least one of the contiguous regions is oriented along a first generally planar area and at least another one of the contiguous regions is oriented along a second generally planar area that is non-planar with respect to the first generally planar area.

5. The device of claim 4, wherein the first generally planar area includes the extended portion, and wherein the conductive structure faces the first generally planar area.

6. The device of claim 1, wherein the conductive structure faces at least two contiguous regions.

7. The device of claim 1, wherein the portion of the first contiguous region in the current path is adapted to switch between a pass state and a blocking state in response to a signal capacitively coupled from the conductive structure via a surface area between the portion of the first contiguous region in the current path and the conductive structure, and wherein the extended portion is adapted to increase the surface area between the conductive structure and the first contiguous region, relative to the surface area between the portion of the first contiguous region in the current path and the conductive structure.

8. The device of claim 1, wherein the extended portion facing the conductive structure includes a non-planar surface.

9. The device of claim 1, wherein the conductive structure includes at least two generally planar sides and wherein the first one of the contiguous regions faces the conductive structure on both of the at least two generally planar sides of the conductive structure.

10. The semiconductor device of claim 1, further comprising a semiconductor substrate having a transistor formed therein, wherein one of the contiguous regions of the thyristor is coupled to a source/drain region of the transistor.

11. The semiconductor device of claim 10, wherein the extended portion is formed in the substrate.

12. The semiconductor device of claim 10, wherein the extended portion is formed over the substrate.

13. The device of claim 1, wherein the thyristor is a thin capacitively coupled thyristor.

14. The semiconductor device of claim 1, the thyristor being adapted to respond to at least one control voltage presented to the gate by passing current through at least one of the contiguous regions of each of the first and second sets.

15. The semiconductor device of claim 1, wherein the conductive structure includes a contiguous portion that encircles one of the contiguous regions of the thyristor.

16. The semiconductor device of claim 1, further comprising silicon on insulator (SOI) structure including a buried insulator layer, wherein at least one of the contiguous regions of the thyristor extends into the buried insulator layer.

17. The semiconductor device of claim 1, further comprising silicon on insulator (SOI) structure including a generally horizontal buried insulator layer having an opening therein and a pass gate having source/drain regions on the buried insulator layer, wherein the thyristor comprises:
   a first emitter region extending below the buried insulator layer;
   a first base region extending into the opening in the insulator layer and contiguously adjacent the first emitter region;
   a second base region extending laterally on the insulator layer and contiguously adjacent the first base region, a portion of the second base region including the extended portion;
   a second emitter region contiguously adjacent the second base region and including a source/drain region of the pass gate; and
   wherein the conductive structure is formed over the second base region and extending laterally over the extended portion.

18. The semiconductor device of claim 1, further comprising a plurality of word lines having a dielectric formed thereon, at least one of the word lines including a gate of a pass gate that is coupled to the thyristor, wherein the thyristor extends over at least two of the word lines.

19. The semiconductor device of claim 1, wherein the conductive structure is adapted to capacitively couple a signal to control the current passing through the thyristor independently from any MOS inversion channel formation against the first contiguous region.

20. A memory array having a plurality of memory cells wherein at least one of the memory cells comprises:

a thyristor having contiguous regions including at least two contiguous regions of different polarity, a first one of the contiguous regions having a portion in a current path traversing two regions of the thyristor other than the first one of the contiguous regions and having an extended portion arranged outside the current path; and a conductive structure facing and capacitively coupled to the extended portion of the first one of the contiguous regions, the conductive structure being adapted to control current passing through the thyristor via the capacitive coupling.

21. A memory cell comprising:

a thin capacitively-coupled thyristor body having an anode end portion including an N-doped base region and a P+ doped emitter region, and having a cathode end portion including a P-doped base region and an N+ doped emitter region, a first one of the base regions having a portion in a current path extending between the other base region and the emitter at the thyristor end portion that includes the first one of the base regions and having an extended portion outside the current path and extended from the thyristor body;

a gate dielectric on the extended portion of the first one of the base regions;

a control gate on the gate dielectric, capacitively coupled to the extended portion via the gate dielectric and adapted to control the thyristor via the capacitive coupling; and a pass gate transistor having a gate and two source/drain regions, one of the source/drain regions being electrically coupled to one of the emitter regions.

22. The memory cell of claim 21, wherein the source/drain region not coupled to the emitter region is coupled to a bitline, wherein the gate of the pass gate transistor forms a first word line, wherein the control gate forms a second word line and wherein the emitter region not electrically coupled to the source/drain region is electrically coupled to a power source, the memory cell being adapted to store an electrical representation of data via inputs from the bitline and wordlines.

23. A memory array having a plurality of memory cells, at least one of the memory cells comprising:

a thin capacitively-coupled thyristor body having an anode end portion including an N-doped base region and a P+ doped emitter region, and having a cathode end portion including a P-doped base region and an N+ doped emitter region, a first one of the base regions having a portion in a current path extending between the other base region and the emitter at the thyristor end portion that includes the first one of the base regions and having an extended portion outside the current path and extended from the thyristor body;

a gate dielectric on the extended portion of the first one of the base regions;

a control gate on the gate dielectric, capacitively coupled to the extended portion via the gate dielectric and adapted to control the thyristor via the capacitive coupling; and a pass gate transistor having a gate and two source/drain regions, one of the source/drain regions being electrically coupled to one of the emitter regions.

* * * * *

UNITED STATES PATENT AND TRADEMARK OFFICE
CERTIFICATE OF CORRECTION

PATENT NO. : 6,583,452 B1 Page 1 of 1
DATED : June 24, 2003
INVENTOR(S) : Cho et al.

It is certified that error appears in the above-identified patent and that said Letters Patent is hereby corrected as shown below:

Drawings,
Figure 5, under 516: "P-Base" should read -- N-Base --

Column 7,
Line 55, delete "("TCCT RAM")".
Line 65, delete "(T-RAM)".

Signed and Sealed this

Eleventh Day of May, 2004

JON W. DUDAS
*Acting Director of the United States Patent and Trademark Office*